US010598875B2

(12) United States Patent
Xie

(10) Patent No.: US 10,598,875 B2
(45) Date of Patent: Mar. 24, 2020

(54) PHOTONIC PACKAGE WITH A BRIDGE BETWEEN A PHOTONIC DIE AND AN OPTICAL COUPLING STRUCTURE

(71) Applicant: Intel Corporation, Santa Clara, CA (US)

(72) Inventor: Boping Xie, San Ramon, CA (US)

(73) Assignee: Intel Corporation, Santa Clara, CA (US)

(*) Notice: Subject to any disclaimer, the term of this patent is extended or adjusted under 35 U.S.C. 154(b) by 0 days.

(21) Appl. No.: 16/220,355

(22) Filed: Dec. 14, 2018

(65) Prior Publication Data
US 2019/0137706 A1    May 9, 2019

(51) Int. Cl.
| | |
|---|---|
| *G02B 6/42* | (2006.01) |
| *H01L 33/54* | (2010.01) |
| *G02B 6/43* | (2006.01) |
| *G02B 6/38* | (2006.01) |
| *H01L 25/16* | (2006.01) |

(52) U.S. Cl.
CPC ......... *G02B 6/4232* (2013.01); *G02B 6/3897* (2013.01); *G02B 6/4202* (2013.01); *G02B 6/4219* (2013.01); *G02B 6/4257* (2013.01); *G02B 6/4274* (2013.01); *G02B 6/4292* (2013.01); *G02B 6/43* (2013.01); *H01L 33/54* (2013.01); *G02B 6/424* (2013.01); *G02B 6/4208* (2013.01); *G02B 6/4244* (2013.01); *G02B 6/4245* (2013.01); *H01L 25/167* (2013.01)

(58) Field of Classification Search
CPC .. G02B 6/4232; G02B 6/4202; G02B 6/3897; G02B 6/4292; G02B 6/43; H01L 33/54; H01L 25/167
See application file for complete search history.

(56) References Cited

U.S. PATENT DOCUMENTS

| | | | | |
|---|---|---|---|---|
| 5,123,074 | A * | 6/1992 | Yokota | G02B 6/42 257/E25.032 |
| 7,702,191 | B1 * | 4/2010 | Geron | G02B 6/43 385/14 |
| 8,971,676 | B1 * | 3/2015 | Thacker | G02B 6/12 385/14 |
| 8,998,509 | B2 * | 4/2015 | Thacker | G02B 6/4284 385/14 |
| 9,250,403 | B2 * | 2/2016 | Thacker | G02B 6/4274 |
| 9,250,406 | B2 * | 2/2016 | Chang | G02B 6/43 |

(Continued)

*Primary Examiner* — Ryan A Lepisto
(74) *Attorney, Agent, or Firm* — Patent Capital Group

(57) ABSTRACT

Disclosed herein are photonic package assemblies, packages, and devices that include photonic dies and optical coupling structures aligned with photonic dies to enable exchange of electromagnetic signals. In one aspect, a photonic package assembly includes a photonic integrated circuit (PIC) die having one or more PICs, and an optical coupling structure (OCS) positioned adjacent to the PIC die such that electromagnetic signals may be exchanged between at least one of the one or more PICs and the OCS. The assembly further includes a structure that forms a bridge, and, thereby, provides mechanical coupling, between the OCS and the PIC die. Providing a bridge structure that directly attaches an OCS to a PIC die may improve achieving and maintaining the desired alignment between the OCS and the PIC die, which may lead to an improved coupling performance over the lifetime of products.

20 Claims, 7 Drawing Sheets

(56) References Cited

U.S. PATENT DOCUMENTS

| | | | | |
|---|---|---|---|---|
| 9,500,821 B2* | 11/2016 | Hochberg | | G02B 6/423 |
| 9,557,478 B2* | 1/2017 | Doerr | | G02B 6/428 |
| 9,570,883 B2* | 2/2017 | Zarbock | | H01L 25/167 |
| 10,025,047 B1* | 7/2018 | Liu | | H01L 25/167 |
| 10,026,723 B2* | 7/2018 | Evans | | G02B 6/12004 |
| 2005/0058408 A1* | 3/2005 | Colgan | | G02B 6/4214 |
| | | | | 385/89 |
| 2011/0206379 A1* | 8/2011 | Budd | | H04B 10/801 |
| | | | | 398/116 |
| 2012/0207426 A1* | 8/2012 | Doany | | G02B 6/426 |
| | | | | 385/14 |
| 2014/0010498 A1* | 1/2014 | Verslegers | | G02B 5/1861 |
| | | | | 385/37 |
| 2014/0203175 A1* | 7/2014 | Kobrinsky | | G02B 6/428 |
| | | | | 250/214.1 |
| 2016/0216445 A1* | 7/2016 | Thacker | | G02B 6/12004 |
| 2016/0377823 A1* | 12/2016 | Garland | | G02B 6/4272 |
| | | | | 385/14 |

* cited by examiner

PHOTONIC PACKAGE WITH A BRIDGE BETWEEN A PHOTONIC DIE AND AN OPTICAL COUPLING STRUCTURE

BACKGROUND

A photonic integrated circuit (photonic IC (PIC)) is a device that integrates photonic functions for information signals imposed on electromagnetic waves, e.g., electromagnetic waves of optical wavelengths. PICs find application in fiber-optic communication, medical, security, sensing, and photonic computing systems.

Coupling a fiber-optic cable, also sometimes referred to as "optical fiber" or, simply, a "fiber," to a PIC so that electromagnetic signals, e.g., optical signals, may exchange between the two is challenging because of the large difference between the mode-field diameter of a fiber and that of a PIC. One way to couple a PIC to a fiber is to implement edge-coupling by using an intermediate optical coupling structure (OCS) (sometimes referred to as "fiber assembly unit" (FAU)) that has one end coupled to a fiber and an opposite end placed proximate to a PIC die (i.e., a die that houses one or more PICs) so that electromagnetic signals may be exchanged between the PICs of the PIC die and the fiber, via the OCS.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example, and not by way of limitation, in the figures of the accompanying drawings.

DETAILED DESCRIPTION

Overview

Figure 1:
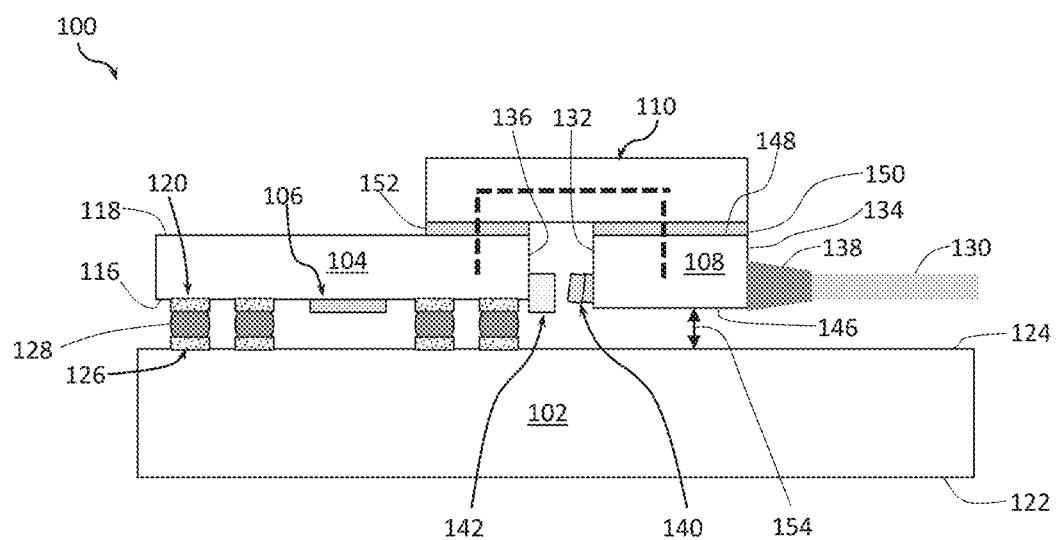
FIG. 1 is a cross-sectional side view of a photonic package assembly with a bridge between a PIC die and an OCS, according to some embodiments of the present disclosure.

For purposes of illustrating photonic package assemblies described herein, it is important to understand phenomena that may come into play during packaging of PICs (photonic packaging). The following foundational information may be viewed as a basis from which the present disclosure may be properly explained. Such information is offered for purposes of explanation only and, accordingly, should not be construed in any way to limit the broad scope of the present disclosure and its potential applications.

As described above, PICs find application in various systems. Taking fiber-optic communication systems as an example of such applications where PICs may, e.g., be used as part of interconnects, as data rate demand continuously drives higher density of connections, packaging of PICs in a way that provides reliable optical coupling, as well as adequate electrical, mechanical, and thermal performance, becomes more challenging and complex. Multiple process steps used in packaging can result in large variations in the position of an input/output (I/O) port (i.e., a port where optical signals may enter and/or exit) of a PIC or a PIC die and that of an associated OCS, which compromises the ability to arrange and control the alignment between the PIC and the OCS so that optical signals between the two can be exchanged consistently. This, in turn, hinders stable coupling between the PIC and the outside world, e.g., between the PIC and a fiber, over a product lifetime.

One conventional approach to attempting that the PIC die and the OCS are properly aligned includes attaching the OCS to a PIC support structure (i.e., a structure that may provide mechanical and electrical support for the PIC die, e.g., a sub-mount, a printed circuit board (PCB), a package substrate, an interposer, etc.). While such an approach may work reasonably well for lower density PIC packaging, such as die attach and wire bonding, it may not be able to yield the level of performance needed for high density packaging architectures such as flip-chip.

Another conventional approach includes providing a fiber assembly in a so-called z-sleeve, where a fiber is enclosed in a sleeve-like structure that surrounds the fiber along its length, and where the fiber with the z-sleeve is then aligned and laser welded to the I/O light source of a PIC or a PIC die. One disadvantage of this approach is that, in general, laser welding is a more expensive solution for providing attachment. In addition, while this alignment approach may work well for a single fiber, it has limited application in array assemblies of fibers, due to both cost and physical size.

Disclosed herein are photonic package assemblies, packages, and device assemblies that include photonic dies and OCSs aligned with the photonic dies to enable exchange of electromagnetic (e.g., optical) signals between photonic dies and OCSs, and, thereby, enable exchange of electromagnetic signals between photonic dies and outside world by means of fiber-optic cables attached to the OCSs. In one aspect of the present disclosure, a photonic package assembly includes a PIC die having one or more PICs, and an OCS positioned adjacent to the PIC die such that electromagnetic signals may be exchanged between at least one of the one or more PICs and the OCS. The assembly further includes a structure that forms a bridge (and, thereby, provides mechanical coupling) between the OCS and the PIC die. In the following, such a structure is referred to as a "bridge structure." Providing a bridge structure that directly attaches an OCS to a PIC die may improve achieving and maintaining the desired alignment between the OCS and the PIC die, which may lead to an improved coupling performance over the lifetime of products that include such an assembly. Such a bridge structure may also be compatible with array assemblies of fibers, enabling higher densities of optical connections and effectively extending the product architecture platform life span. Other advantages may include reducing tolerance stack for fiber-optic coupling and tighter bond line control for the attachment of the OCS.

Each of the structures, assemblies, packages, methods, devices, and systems of the present disclosure may have several innovative aspects, no single one of which being solely responsible for the all of the desirable attributes disclosed herein. Details of one or more implementations of the subject matter described in this specification are set forth in the description below and the accompanying drawings.

In the following detailed description, various aspects of the illustrative implementations may be described using terms commonly employed by those skilled in the art to convey the substance of their work to others skilled in the art. For example, the term "connected" means a direct connection (which may be one or more of a mechanical, electrical, and/or thermal connection) between the things that are connected, without any intermediary devices, while the term "coupled" means either a direct connection between the things that are connected, or an indirect connection through one or more passive or active intermediary devices. The term "circuit" means one or more passive and/or active components that are arranged to cooperate with one another to provide a desired function. The terms "substantially," "close," "approximately," "near," and "about," generally refer to being within +/−20% of a target value (e.g., within +/−5 or 10% of a target value) based on the context of a particular value as described herein or as known in the art. Similarly, terms indicating orientation of various elements, e.g., "coplanar," "perpendicular," "orthogonal," "parallel," or any other angle between the elements, generally refer to being within +/−5-20% of a target value based on the context of a particular value as described herein or as known in the art.

The terms "over," "under," "between," and "on" as used herein refer to a relative position of one material layer or component with respect to other layers or components. For example, one layer disposed over or under another layer may be directly in contact with the other layer or may have one or more intervening layers. Moreover, one layer disposed between two layers may be directly in contact with one or both of the two layers or may have one or more intervening layers. In contrast, a first layer described to be "on" a second layer refers to a layer that is in direct contact with that second layer. Similarly, unless explicitly stated otherwise, one feature disposed between two features may be in direct contact with the adjacent features or may have one or more intervening layers.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B, and C). The term "between," when used with reference to measurement ranges, is inclusive of the ends of the measurement ranges. When used herein, the notation "A/B/C" means (A), (B), and/or (C).

The description uses the phrases "in an embodiment" or "in embodiments," which may each refer to one or more of the same or different embodiments. Furthermore, the terms "comprising," "including," "having," and the like, as used with respect to embodiments of the present disclosure, are synonymous. The disclosure may use perspective-based descriptions such as "above," "below," "top," "bottom," and "side"; such descriptions are used to facilitate the discussion and are not intended to restrict the application of disclosed embodiments. The accompanying drawings are not necessarily drawn to scale. Unless otherwise specified, the use of the ordinal adjectives "first," "second," and "third," etc., to describe a common object, merely indicate that different instances of like objects are being referred to, and are not intended to imply that the objects so described must be in a given sequence, either temporally, spatially, in ranking or in any other manner.

In the following detailed description, reference is made to the accompanying drawings that form a part hereof, and in which is shown, by way of illustration, embodiments that may be practiced. It is to be understood that other embodiments may be utilized, and structural or logical changes may be made without departing from the scope of the present disclosure. Therefore, the following detailed description is not to be taken in a limiting sense.

In the drawings, same reference numerals refer to the same or analogous elements/materials shown so that, unless stated otherwise, explanations of an element/material with a given reference numeral provided in context of one of the drawings are applicable to other drawings where element/materials with the same reference numerals may be illustrated. Furthermore, in the drawings, some schematic illustrations of example structures of various structures, devices, and assemblies described herein may be shown with precise right angles and straight lines, but it is to be understood that such schematic illustrations may not reflect real-life process limitations which may cause the features to not look so "ideal" when any of the structures described herein are examined using, e.g., images of suitable characterization tools such as scanning electron microscopy (SEM) images, transmission electron microscope (TEM) images, or non-contact profilometers. In such images of real structures, possible processing and/or surface defects could also be visible, e.g., surface roughness, curvature or profile deviation, pit or scratches, not-perfectly straight edges of materials, tapered vias or other openings, inadvertent rounding of corners or variations in thicknesses of different material layers, occasional screw, edge, or combination dislocations within the crystalline region(s), and/or occasional dislocation defects of single atoms or clusters of atoms. There may be other defects not listed here but that are common within the field of photonic device fabrication and/or packaging.

Various operations may be described as multiple discrete actions or operations in turn in a manner that is most helpful in understanding the claimed subject matter. However, the order of description should not be construed as to imply that these operations are necessarily order dependent. In particular, these operations may not be performed in the order of presentation. Operations described may be performed in a different order from the described embodiment. Various additional operations may be performed, and/or described operations may be omitted in additional embodiments.

Photonic Package Assemblies with a Bridge Structure

FIG. 1 is a cross-sectional side view of a photonic package assembly 100, according to some embodiments of the present disclosure. As shown, the photonic package assembly 100 may include a support structure 102, which may be referred to as a "PIC support structure" because it is used to provide mechanical, and, optionally, also electrical, support for a PIC die 104 that may include one or more PICs 106. In various embodiments, the PIC support structure 102 may be any one of a substrate (e.g., a package substrate as described with reference to FIG. 5), an interposer (e.g., an interposer as described with reference to FIG. 5 or 6), or a circuit board (e.g., a circuit board as described with reference to FIG. 6). As also shown, the photonic package assembly 100 may further include an OCS 108, as well as a bridge structure 110, configured to mechanically attach the OCT 108 to the PIC die 104.

The PIC die 104 may include a first face 116 and an opposing second face 118. One or more PICs 106 may be proximate to or provided on the first face 116, in case the PIC die 104 is attached to the PIC support structure 102 in a flip-chip (also referred to as "controlled collapse chip connection," C4) configuration, as illustrated in FIG. 1. FIG. 1 illustrates only one such PIC 106 in order to not clutter the drawing, but, in various embodiments of the assembly 100, any number of one or more PICs 106 may be implemented on the PIC die 104. In general, as used herein, the term "PIC" (e.g., any of the PICs 106) is used to describe a device configured to, e.g., transmit and/or process electromagnetic signals having information encoded therein (or, phrased differently, transmit and/or process information imposed on electromagnetic signals, e.g., a PIC may generate and modulate electromagnetic signals to include information, and/or to convert electromagnetic signals to electrical signals). To that end, any of the PICs 106 may include an electromagnetic source, a modulator, and an electromagnetic signal launcher. Often times, the electromagnetic signals are signals of optical wavelengths and, therefore, some descriptions provided herein refer to "optical" signals and "optical" components (e.g., "optical coupling structure"). However, the PICs 106 described herein are not limited to operating with electromagnetic signals of optical spectrum and descriptions provided herein with reference to optical signals and/or optical components are equally applicable to electromagnetic signals of any suitable wavelength, such as electromagnetic signals in near infrared (NIR) and/or infrared (IR) bands, as well as electromagnetic signals in the radio frequency (RF) and/or microwave bands. In some embodiments, an electromagnetic source of a PIC 106 may include 1) an oscillator, if the PIC 106 supports wavelengths on the millimeter scale, 2) a laser, if the PIC 106 supports wavelengths between about 0.8 and 1.7 micrometer, or 3) some combination of an oscillator and a laser, if the PIC 106 supports wavelengths between 0.8 micrometer and millimeters or centimeters. In some embodiments, a modulator of a PIC 106 may be any device/component configured to encode information in/on to the electromagnetic signals. In some embodiments, an electromagnetic signal launcher of a PIC 106 may include any component configured to feed, or launch, the electromagnetic signal into the medium of propagation. In some embodiments, an electromagnetic signal launcher may further be configured to perform a frequency or wavelength multiplexing function, e.g., frequency division multiplexing (FDM) or wavelength division multiplexing (WDM). Examples of the one or more PICs 106 include, but are not limited to, optical transmitter output waveguides and their associated sub-components, optical receiver input waveguides and their associated sub-components, photo diodes, etc. The waveguides which may be implemented in the one or more PICs 106 may be silicon photonic waveguides, e.g., those based on silicon-on-isolator (SOI) platform, configured to transmit/receive electromagnetic radiation of any wavelength bands from about 0.8 micrometer to about 5 centimeter. For example, one or more PICs 106 supporting wavelengths from about 1.2 micrometer to about 1.7 micrometer (i.e., wavelengths in the NIR and/or IR bands) may be used for data communications and telecommunications. In another example, one or more PICs 106 supporting wavelengths from about 1 millimeter to about 10 millimeter (i.e., wavelengths in the extremely high frequency (EHF) band of radio/micro-waves), in particular, wavelengths of about 2 millimeter, may be used for radar and RF wireless communications.

Furthermore, in some embodiments, the PIC die 104 may further include one or more electronic ICs (i.e., ICs which are not photonic), not specifically shown in FIG. 1. Examples of the ones or more electronic ICs that may also be provided over the PIC die 104 include, but are not limited to, one or more of laser drivers, voltage converters, transimpedance amplifiers (TIA), clock and data recovery (CDR) components, microcontrollers, etc.

The PIC die 104 may include a substrate that may include any material that may serve as a foundation for the PIC 106. In some embodiments, the substrate of the PIC die 104 may be a semiconductor substrate composed of semiconductor material systems including, for example, N-type or P-type materials systems. The substrate of the PIC die 104 may include, for example, a crystalline substrate formed using a bulk silicon (or other bulk semiconductor material) or a SOI structure (or, in general, a semiconductor-on-insulator structure). In some embodiments, the substrate of the PIC die 104 may be formed using alternative materials, which may or may not be combined with silicon, that include, but are not limited to, germanium, silicon germanium, indium antimonide, lead telluride, indium arsenide, indium phosphide, gallium arsenide, aluminum gallium arsenide, aluminum arsenide, indium aluminum arsenide, aluminum indium antimonide, indium gallium arsenide, gallium nitride, indium gallium nitride, aluminum indium nitride or gallium antimonide, or other combinations of group III-N or group IV materials. In some embodiments, the substrate of the PIC die 104 may be non-crystalline. In some embodiments, the substrate of the PIC die 104 may be a PCB. In some embodiments, the substrate of the PIC die 104 may be inhomogeneous, e.g., including a carrier material (such as glass or silicon carbide) with a thin semiconductor layer at the second or upper face 118. Although a few examples of the substrate of the PIC die 104 are described here, any material or structure that may serve as a foundation upon which the PIC 106 may be built falls within the spirit and scope of the present disclosure. The substrate of the PIC die 104 may be part of a singulated die or a wafer.

As shown in FIG. 1, a plurality of conductive contacts 120 may be disposed at the first face 116 of the PIC die 104. Conductive pathways (not specifically shown in FIG. 1) may extend and be coupled between the conductive contacts 120 and the various ICs implemented in the PIC die 104, where, in various embodiments, such conductive pathways may be implemented as conductive vias, conductive lines, and/or any combination of conductive vias and lines. In various embodiments, the conductive contacts 120 may be formed of any suitable conductive material. The conductive contacts 120 may take form of, e.g., solder bond pads, conductive epoxies, anisotropic conductive films, copper to copper bonding posts, or any other first-level interconnect structures, to route electrical signals to/from the PIC die 104, as discussed below.

The PIC support structure 102 may include a first face 122 and an opposing second face 124. Conductive contacts 126 may be disposed at the second face 124, as shown in FIG. 1. In some embodiments, similar conductive contacts may be disposed at the first face 122 (not specifically shown in FIG. 1). In such embodiments, conductive pathways (also not specifically shown in FIG. 1) may extend through an insulating material of the PIC support structure 102 between the first face 122 and the second face 124 of the PIC support structure 102, electrically coupling various ones of the conductive contacts 126 at the second face 124 to various ones of the conductive contacts at the first face 122, in any desired manner. The insulating material of the PIC support structure 102 may be a dielectric material, e.g., any of the suitable materials typically used as an interlayer dielectric (ILD). Examples of the insulating material of the PIC support structure 102 may include, in some embodiments, silicon oxide, silicon nitride, aluminum oxide, and/or silicon oxynitride. The conductive pathways through the PIC support structure 102 may include one or more conductive vias, one or more conductive lines, or a combination of conductive vias and conductive lines, for example.

In some embodiments, the PIC support structure 102 may be or may otherwise include a silicon interposer, and the conductive pathways through the PIC support structure 102 may be through-silicon vias. Silicon may have a desirably low coefficient of thermal expansion compared with other dielectric materials that may be used, and thus may limit the degree to which the PIC support structure 102 expands and contracts during temperature changes relative to such other materials (e.g., polymers having higher coefficients of thermal expansion). A silicon interposer may also help the PIC support structure 102 achieve a desirably small line width and maintain high connection density to the PIC die 104.

In some embodiments, the PIC support structure 102 may be a substrate, e.g., any one of the substrates described above with reference to the PIC die 104.

The conductive contacts 120 of the PIC die 104 may be electrically coupled to the conductive contacts 126 of the PIC support structure 102 via first-level interconnects 128. In some embodiments, the first-level interconnects 128 may include solder bumps or balls (as illustrated in FIG. 1); for example, the first-level interconnects 128 may be flip-chip or C4 bumps disposed initially on the PIC die 104 or on the PIC support structure 102. In some embodiments, the PIC die 104 may be brought in contact with the PIC support structure 102 using a pick-and-place apparatus, for example, and a reflow or thermal compression bonding operation may be used to couple the PIC die 104 to the PIC support structure 102 via the first-level interconnects 128.

Second-level interconnects (e.g., solder balls or other types of interconnects; not specifically shown in FIG. 1) may be present on the first face 122 of the PIC support structure 102, to couple the PIC support structure 102 to another component, such as a circuit board (not specifically shown in FIG. 1).

Having first-level interconnects 128 disposed between the first face 116 of the PIC die 104 and the second face 124 of the PIC support structure 102 (e.g., using solder bumps as part of flip-chip packaging techniques) may enable the photonic package assembly 100 to achieve a smaller footprint and higher die-to-package-substrate connection density than could be achieved using conventional wirebond techniques (in which conductive contacts between the PIC die 104 and the PIC support structure 102 are constrained to be located on the periphery of the PIC die 104). For example, a PIC die 104 having a square first face 116 with side length N may be able to form 4N wirebond interconnects to the PIC support structure 102, versus $N^2$ flip-chip interconnects (utilizing the entire "full field" surface area of the first face 116). Additionally, in some applications, wirebond interconnects may generate unacceptable amounts of heat that may damage or otherwise interfere with the performance of the PIC 106. Using the first-level interconnects 128 may enable the photonic package assembly 100 to have much lower parasitic inductance relative to using wirebonds to couple the PIC die 104 and the PIC support structure 102, which may result in an improvement in signal integrity for high speed signals communicated between the PIC die 104 and the PIC support structure 102.

In some embodiments, the surface of the PIC die 104 around the contacts 120 may be coated with a material which is not wetted by, e.g., the solder material of the first-level interconnects 128. This material is generally known as a solder mask and can take any appropriate form, such as silicon nitride, aluminum oxide, and silicon oxide. The presence of this solder mask material enables solder mask defined contacts.

In some embodiments, a solder resist material (not specifically shown in FIG. 1) may be disposed around the conductive contacts 126. The solder resist material may be a polyimide or similar material, or may be any appropriate type of packaging solder resist material. In some embodiments, the solder resist material may be a liquid or dry film material including photoimageable polymers. In some embodiments, the solder resist material may be non-photoimageable.

In various embodiments, more or fewer elements described above may be included in the PIC support structure 102 and the PIC die 104. In some embodiments, conductive lines of the PIC die 104 and the PIC support structure 102 may extend into and out of the plane of the drawing, providing conductive pathways to route electrical signals to and/or from various elements in the PIC die 104.

The conductive vias and/or lines that provide the conductive pathways in/on the PIC die 104 or/and in/on the PIC support structure 102 may be formed using any suitable techniques. Examples of such techniques may include subtractive fabrication techniques, additive or semi-additive fabrication techniques, single Damascene fabrication techniques, dual Damascene fabrication techniques, or any other suitable techniques. In some embodiments, layers of insulator material, such as e.g. oxide material or nitride material, may insulate various structures in the conductive pathways from proximate structures, and/or may serve as etch stops during fabrication. In some embodiments, additional layers, such as e.g. diffusion barrier layers or/and adhesion layers may be disposed between conductive material and proximate insulating material. Diffusion barrier layers may reduce diffusion of the conductive material into the insulating material. Adhesion layers may improve mechanical adhesion between the conductive material and the insulating material.

As noted above, interconnect structures may be arranged within the PIC die 104 and in the PIC support structure 102 to route electrical signals according to a wide variety of designs. During operation of the PIC 106, electrical signals (such as e.g. power, input/output (I/O) signals, including various control signals for external and internal control of the PIC 106) may be routed to and/or from the PIC 106 of the PIC die 104 through the interconnects provided by the conductive contacts and conductive pathways of the PIC die 104 and the PIC support structure 102.

The conductive contacts 120 and/or 126 may include multiple layers of material that may be selected to serve different purposes. In some embodiments, the conductive contacts 120 and/or 126 may be formed of aluminum, and may include a layer of gold (e.g., with a thickness of less than 1 micron) between the aluminum and the adjacent interconnect to limit the oxidation of the surface of the contacts and improve the adhesion with adjacent solder. Alternate materials for the surface finish include palladium, platinum, silver and tin. In some embodiments, the conductive contacts 120 and/or 126 may be formed of aluminum, and may include a layer of a barrier metal such as nickel, as well as a layer of gold, or other appropriate material, wherein the layer of barrier metal is disposed between the aluminum and the layer of gold, and the layer of gold is disposed between the barrier metal and the adjacent interconnect. In such embodiments, the gold, or other surface finish, may protect the barrier metal surface from oxidation before assembly, and the barrier metal may limit the diffusion of solder from the adjacent interconnects into the aluminum.

Turning to other components of the photonic package assembly 100, FIG. 1 further illustrates a bridge structure 110, mechanically coupling the OCS 108 to the PIC die 104 so that optical signals may be exchanged between the OCS 108 and the one or more PICs 106 of the PIC die 104. The OCS 108 and the PIC die 104 may be provided over different portions of the PIC support structure 102, thus realizing edge-coupling type of optical coupling between the OCS 108 and the PIC die 104.

The OCS 108 may be any structure configured to optically couple a fiber-optic cable (or, simply, fiber) 130 to the PIC die 104 so that optical signals may be exchanged between the fiber 130 and the one or more PICs 106 of the PIC die 104. To that end, the OCS 108 may include a first end 132 and a second end 134, where, during operation of the photonic package assembly 100, the first end 132 may face the edge 136 of the PIC die 104, using a suitable coupling element such as a polished fiber or waveguide, and at the second end 134 (which is opposite the first end 132) may be fixed at or coupled to the fiber 130, e.g., using a suitable element such as soft epoxy or fixing material that may be applied for stress relief. In some embodiments, the OCS 108 may have an isolator 140, provided at the first end 132. The isolator 140 is a device that is configured to reduce the back reflections that may otherwise go back to the PIC 106. To that end, the isolator 140 may be provided in an optical path between the OCS 108 and the PIC die 104 when the bridge structure 110 couples the OCS 108 to the PIC die 104. In various embodiments, the isolator 140 may be either a polarization-dependent, or a polarization-independent isolator. Also shown in FIG. 1, the PIC die 104 may include a lens array 142, which may include one or more lenses, attached to the edge 136 of the PIC die 104. During operation of the photonic package assembly 100, the lens array 142 may be opposite the OCS 108, e.g., opposite the isolator 140, and may be configured to assist achieving optimal alignment to ensure the maximum optical power coupled into fiber 130.

The bridge structure 110 includes the word "bridge" in its name because it forms a bridge between the PIC die 104 and the OCS 108. In particular, considering that a first face 146 of the OCS 108 is the face closest to the PIC support structure 102 (similar to the first face 116 of the PIC die 104), and that a second face 148 of the OCS 108 is the face opposite its first face 146, the bridge structure 110 may mechanically couple the OCS 108 and the PIC die 104 by being attached to (namely, by having respective portions attached to) at least a portion of the second face 118 of the PIC die 104 and at least a portion of the second face 148 of the OCS 108. While FIG. 1 illustrates that the entire second face 148 of the OCS 108 is attached to a portion of the bridge structure 110, in other embodiments, only a portion of the second face 148, e.g., a portion closest to the first face 132 of the OCS 108, may be attached to the bridge structure 110, similar to how FIG. 1 illustrates that only a portion of the second face 118 of the PIC die 104 is attached to the bridge structure 110. As further shown in FIG. 1, one portion of the bridge structure 110 may be attached to the [portion of] the second face 148 of the OCS 108 using any suitable attachment means 150, such as any suitable epoxy material (e.g., ultraviolet (UV) cure epoxy and/or thermal cure epoxy) and/or soldering. Thus, in some embodiments, the bridge structure 110 may be attached to the OCS 108 using epoxy and/or soldering. In other embodiments, the bridge structure 110 may be attached to the OCS 108 using laser curling, laser welding, or any attachment means that solidifies in a relatively short time and with relatively little movement. In various embodiments, the bridge structure 110 may be pre-attached to, or assembled passively with, the OCS 108, and only later attached to the PIC die. Similarly, another portion of the bridge structure 110 may be attached to the [portion of] the second face 118 of the PIC die 104 using any suitable attachment means 152. In some embodiments, the attachment means 152 may include any of the means and materials listed for the attachment means 150, e.g., may include any suitable attachment means that solidifies in a relatively short time and with relatively little movement. In other embodiments, these two means of attachment may be different, e.g., to reflect that the OCS 108 may be attached to the bridge structure 110 first, and then the bridge structure 110 with the OCS 108 attached thereto is actively aligned above the PIC die 104 to make sure the elements at the opposite faces of the OCS 108 and the PIC die 104 (e.g., the isolator 140 and the lens array 142) face one another at the correct level to enable exchange of optical signals between the OCS 108 and the PIC die 104. Once properly aligned, the bridge structure 110 may then be attached to the PIC die 104 using the attachment means 152. In this manner, the OCS 108, attached to the bridge structure 110, may first be optically aligned to the photonics IC source, e.g. to the PIC 106, and then be directly attached to the PIC die 104. A part of the OCS 108 that includes the portion of second face 148 of the OCS 108 that is attached to the bridge structure 110, the bridge structure 110 itself, and a part of the PIC die 104 that includes the portion of the second face 118 of the PIC die 104 that is attached to the bridge structure 110 then form a bridge, the bridge schematically illustrated in FIG. 1 with a thick dashed line.

As shown in FIG. 1, the bridge structure 110 may be such that it covers portions of the second face of each of the PIC die 104 and the OCS 108, but no portion of the bridge structure is provided on, or attached to, the first face 146 of the OCS 108. In some embodiments, the bridge structure 110 may be a planar structure (i.e., a flat structure, as opposed to, e.g. a curved structure), also as shown in FIG. 1, covering respective portions of the second face of each of the PIC die 104 and the OCS 108. In other embodiments, at least only the portions of the bridge structure 110 which are attached to respective portions of the second face of each of the PIC die 104 and the OCS 108 may be planar portions, while the portion of the bridge structure 110 in between these planar portions may, e.g., be [slightly] curved or otherwise irregularly shaped.

FIG. 1 further illustrates that, in some embodiments, the first face 146 of the OCS 108 may face (i.e., be opposite to) the PIC support structure 102 and the bridge structure 110 may suspend the OCS 108 above the PIC support structure 102 so that the first face 146 of the OCS 108 is separated from the PIC support structure 102 by a gap. The gap may be at least 50 micrometers, the dimension shown in FIG. 1 as a dimension 154 illustrated with a double-arrow, as measured in a direction perpendicular to the PIC support structure 102.

In some embodiments, the bridge structure 110 may be formed of a material that is substantially transparent to certain wavelength ranges of light, e.g., substantially transparent to the UV light. In some embodiments, the bridge structure 110 may be formed of a material that has sufficiently low coefficient of thermal expansion, e.g., below about 7 parts per million per degree Centigrade (ppm/° C.), preferably below about 2-3 ppm/° C. Examples of materials which may be used to form the bridge structure 110 include, but are not limited to, borosilicate glass, quartz or silica.

Figure 2A:
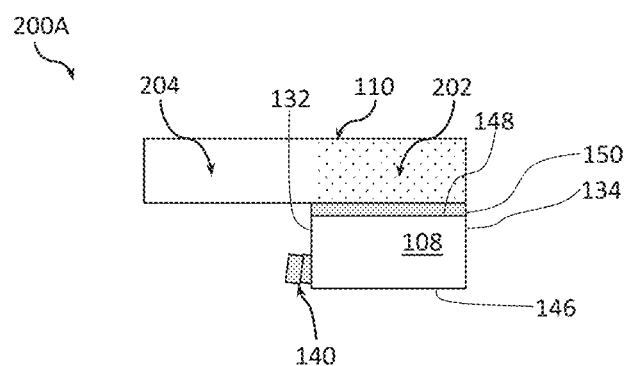
FIGS. 2A-2B are cross-sectional side views of a photonic coupling assembly that includes a bridge structure coupled to an OCS, according to some embodiments of the present disclosure.
Figure 2B:
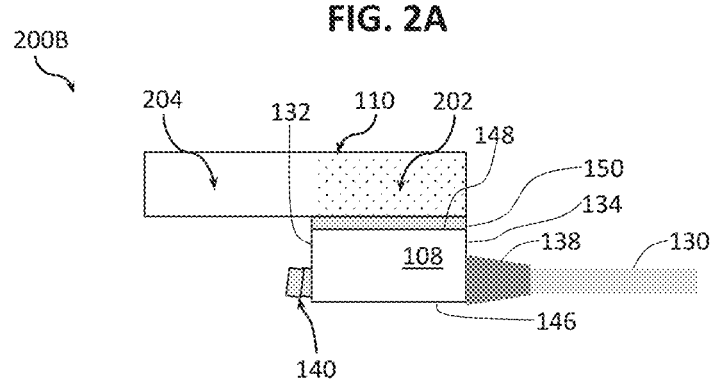

Since, as described above, the bridge structure 110 may be mechanically coupled to the OCS 108 first, before it is coupled to the PIC die 104, FIGS. 2A and 2B are provided to illustrate examples of photonic coupling assemblies illustrating the order in which elements of the final photonic package assembly 100 may be arranged. FIG. 2A illustrates an optical assembly 200A that includes the OCS 108 and the bridge structure 110, as described above. FIG. 2B illustrates an optical assembly 200B that is substantially the same as the optical assembly 200A, except that it further includes the fiber 130 attached to the second end 134 of the OCS 108. As shown in FIGS. 2A and 2B, the bridge structure 110 may be seen as including a first planar portion 202 (identified in FIGS. 2A and 2B as a portion of the bridge structure 110 that includes dots), attached to at least a portion, or all of, the second face 148 of the OCS 108; and further including a second planar portion 204 (identified in FIGS. 2A and 2B as a portion of the bridge structure 110 that does not include any dots), configured to be attached, at a later point in time, to at least a portion, or all of, the second face 118 of the PIC die 104. Such a second portion 204 may extend away from the OCS 108, or, in other words, extend away from the first portion 202. As shown in FIGS. 2A and 2B, in some embodiments, the first planar portion 202 of the bridge structure 110 may be attached to the portion of the OCS 108 that is proximate the first end 132 of the OCS 108, but, in other embodiments of the photonic coupling assembly 200A-200B and the photonic package assembly 100, the first portion 202 of the bridge structure 110 may be attached to other portions of the second face 148 of the OCS 108. As used herein, the first and second portions 202, 204 are described as "planar" only to indicate that these portions are to be attached to upper, plane surfaces of the OCS 108 and the PIC die 104 and do not, e.g., wrap around the OCS 108 and the PIC die 104. In various embodiments, the first and second portions 202, 204 may have wavy surfaces (at the side closest to the PIC support structure 102, once assembled into a photonic package assembly, e.g., as shown in FIG. 1), e.g., to promote attachment to the OCS 108 and/or to the PIC die 104.

Figure 3:
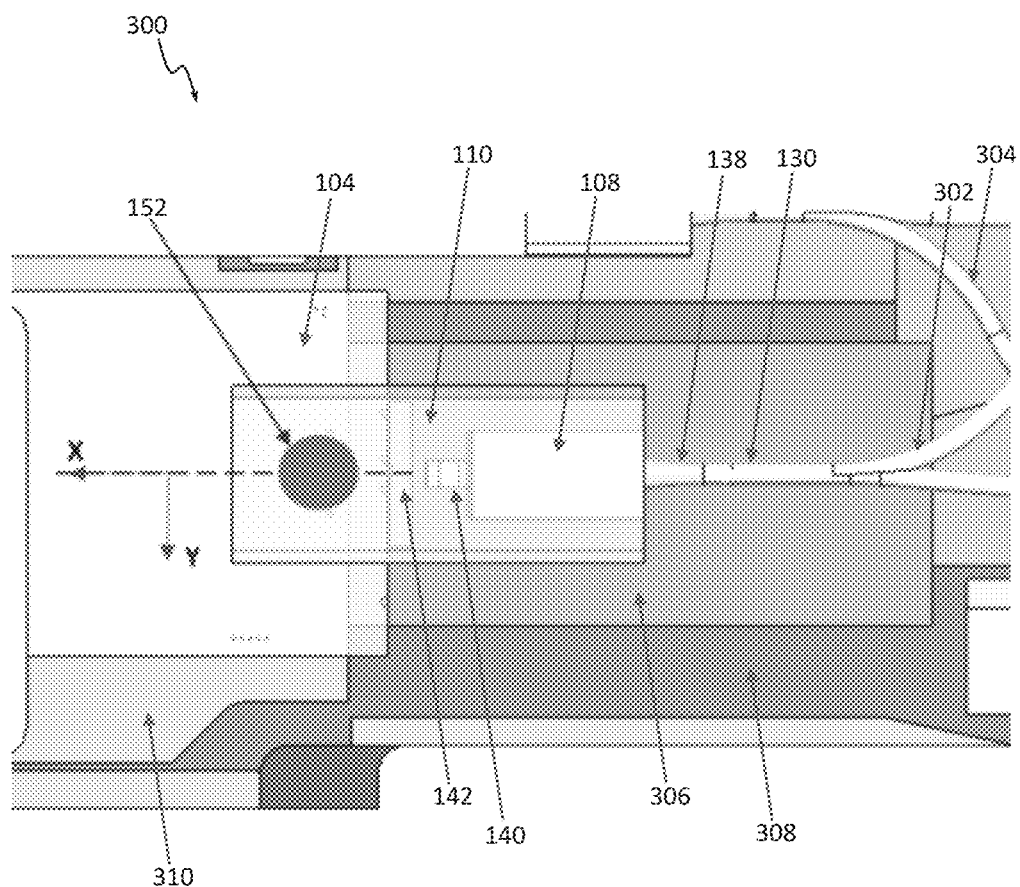
FIG. 3 is a top-down view of a photonic package assembly with a bridge between a PIC die and an OCS, according to some embodiments of the present disclosure.

FIG. 3 is a top-down view of an example photonic package assembly 300 with a bridge between a PIC die and an OCS, according to some embodiments of the present disclosure. The photonic package assembly 300 may be seen as an alternative view or arrangement of the photonic package assembly 100, described above, something that can be detected or identified using visual inspection and/or reverse engineering techniques that may be used to identify the use of the bridge structure as described herein. In particular, FIG. 3 illustrates the bridge structure 110, provided as a rectangular block having one portion that overlaps with the OCS 108 and another portion that overlaps with the PIC die 104. FIG. 3 also illustrates the fiber 130, coupled to the OCS 108 via the coupling element 138, and further illustrates the isolator 140 and the lens array 142, as described above. Still further, FIG. 3 illustrates an embodiment where the attachment means 152 is provided as a drop of epoxy, to mechanically couple the bridge structure 110 to the PIC die 104. Thus, although the attachment means 152 and 150 are shown in FIG. 1 as extending along the entire length of the interfaces between a respective portion of the bridge structure 110 and portions of the PIC die 104 and the OCS 108, in other embodiments, one or both of the attachment means 152 and 150 may be provided only in portions of the respective interfaces (e.g., as a single drop of epoxy as shown in FIG. 3, as multiple discrete drops, etc.).

FIG. 3 further illustrates other components which may be present in the photonic package assembly 300, e.g., fibers 302 and 304, which may be part of the fiber 130 after routing, clearance area 306 for the bridge structure 110 in the PIC support structure 102, main PCB substrate 308 in this case or PIC support structure 102, and integrated photonics module or engine 310 that may include the PIC die 104 and other ICs, and flip-chip attached to substrate 308, to name a few.

Various assemblies with a bridge between a PIC die and an OCS as described herein, e.g., the photonic package assemblies 100 or 300, or photonic coupling assemblies 200A-200b, described with reference to FIGS. 1-3, do not represent an exhaustive set of arrangements utilizing bridge structures in a manner that allows providing improved optical alignment between the OCS and the PIC die but merely provide examples of such arrangements. Although particular arrangements of materials are discussed with reference to FIGS. 1-3 illustrating example assemblies, in some embodiments, various intermediate materials may be included in various portions of the assemblies of these FIGS. Note that FIGS. 1-3 are intended to show relative arrangements of the components within their assemblies, and that, in general, such assemblies may include other components that are not illustrated (e.g., various interfacial layers or various other components related to, e.g., optical functionality, electrical connectivity, or thermal mitigation). In particular, in some further embodiments, the photonic assemblies as shown in FIGS. 1-3 may include multiple bridge structures 110 with each bridge structure 110 mechanically coupled to a respective OCS 108, and/or include at least one bridge structure 110 mechanically coupled to multiple OCSs 108, and/or include at least one OCS 108 coupled to two or more fibers 130; where all of these different arrangements of bridge structures and OCSs may be mechanically coupled to a single PIC die 104, or at least some of such different arrangements of bridge structures and OCSs may be mechanically coupled to multiple such dies. Additionally, although some components of the assemblies are illustrated in FIGS. 1-3 as being planar rectangles or formed of rectangular solids, this is simply for ease of illustration, and embodiments of these assemblies, in particular embodiments of the bridge structure 110, the OCS 108, and the PIC die 104, may be curved, rounded, or otherwise irregularly shaped as dictated by, and sometimes inevitable due to, the manufacturing processes used to fabricate various components.

In various embodiments, any of the features discussed with reference to any of FIGS. 1-3 herein may be combined with any other features to form a photonic package assembly with one or more bridge structures as described herein, e.g., to form a modified photonic assembly 100 or 300, or to form a modified photonic coupling assembly 200. Some such combinations are described above, but, in various embodiments, further combinations and modifications are possible.

Manufacturing Photonic Assemblies with a Bridge Structure

Various photonic assemblies with bridge structures as disclosed herein may be manufactured using any suitable techniques. In some implementations, a choice of fabrication processes may depend on how the PIC die 104 is coupled to the PIC support structure 102 (e.g., using a flip-chip arrangement as described above, or using some other arrangement). In some implementations, a choice of a technique may depend on whether the bridge structure 110 is first coupled to the OCS 108 and only later is coupled to the PIC die 104, or coupled to the OCS 108 and the PIC die 104 in any other order.

Figure 4:
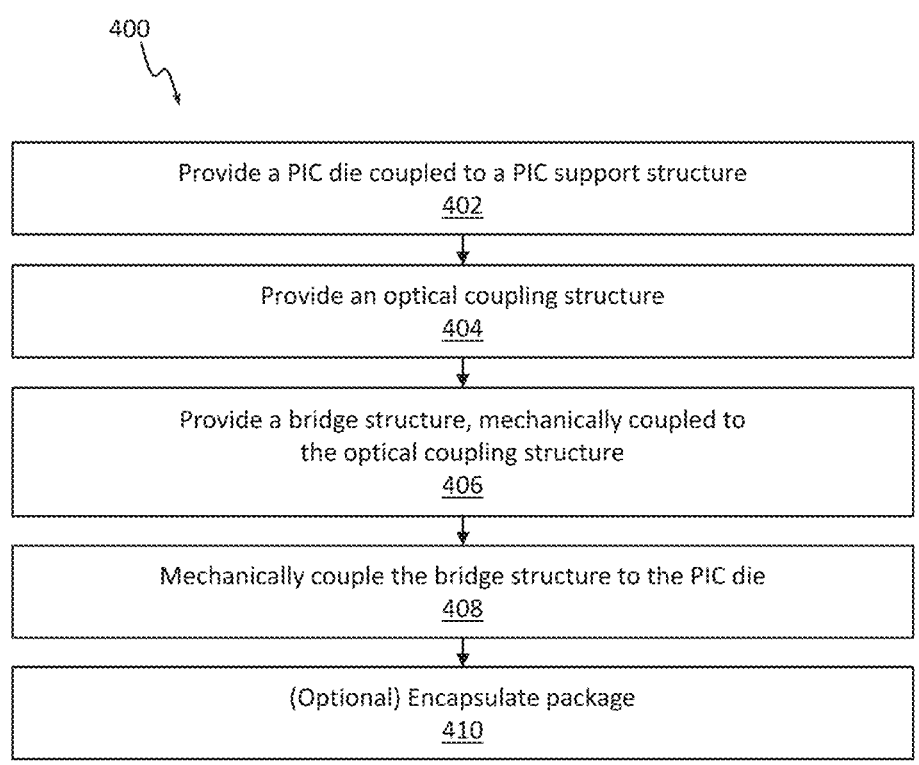
FIG. 4 is a flow diagram of an example method of fabricating a photonic package assembly with a bridge between a PIC die and an OCS, according to various embodiments of the present disclosure.

FIG. 4 is a flow diagram of an example method 400 of fabricating a photonic package assembly with a bridge between a PIC die and an OCS, according to various embodiments of the present disclosure.

Although the operations of the method 400 are illustrated in FIG. 4 once each and in a particular order, the operations may be performed in any suitable order and repeated as desired. For example, one or more operations may be performed in parallel to manufacture multiple bridge structures between a single PIC die and multiple OCSs, or to manufacture multiple photonic package assemblies (i.e., different PIC dies) with such bridge structures, substantially simultaneously. In another example, the operations may be performed in a different order to reflect the structure of a particular photonic package assembly in which one or more bridge structures as described herein may be included.

Furthermore, the operations illustrated in FIG. 4 may be combined or may include more details than described. For example, a process 404 of providing an OCS and a process 406 of providing a bridge structure, coupled to the OCS, may happen in a single process step, e.g., when a bridge structure is pre-fabricated to include the OCS attached thereto. In another example, the process 402 of providing a PIC die attached to the PIC support structure may include multiple processes, e.g., those conventionally used to provide flip-chip connections between IC dies and support structures.

Still further, the method 400 shown in FIG. 4 may further include other manufacturing operations related to fabrication of other components of the photonic assemblies described herein, or any devices that may include photonic assemblies as described herein. For example, the method shown in FIG. 4 may include various cleaning operations, surface planarization operations (e.g., using chemical mechanical polishing), operations for surface roughening, operations to include barrier and/or adhesion layers as desired, and/or operations for incorporating the bridge structures as described herein in, or with, an IC component, a computing device, or any desired structure or device.

The method 400 shown in FIG. 4 may begin with a process 402 that includes providing a PIC die coupled to a PIC support structure. For example, the process 402 may include providing the PIC die 104 having one or more PICs 106 housed therein, in a flip-chip configuration with the PIC support structure 102, as described above.

The method 400 may include a process 404 of providing an OCS. For example, the process 404 may include providing the OCS 108, described above.

The method 400 may include a process 406 of providing a bridge structure, mechanically coupled to the OCS. For example, the process 406 may include providing a photonic coupling assembly as shown in FIG. 2A or FIG. 2B, which includes the bridge structure 110 having the OCS 108 attached thereto, as described above.

The method 400 may include a process 408 of mechanically coupled the bridge structure to the PIC die. For example, the process 408 may include mechanically attaching the photonic coupling assembly as shown in FIG. 2A or 2B to the PIC die 104, e.g. as shown in FIG. 1 or 3. In some other embodiments, the method 400 may include mechanically attaching the bridge structure 110 to the PIC die 104 before attaching it to the OCS 108, or mechanically attaching the bridge structure 110 to the OCS 108 and the PIC die 104 substantially simultaneously, or in a time-overlapping manner.

Once the bridge structure has been provided and has been arranged to mechanically couple the PIC die and the OCS (possibly including one or more fibers coupled to the OCS), the method 400 may include an optional process 410 of encapsulating the entire assembly. For example, the process 404 may include providing a layer of a suitable dielectric material over the photonic package assembly as shown in FIG. 1 or 3, e.g., to reduce or minimize oxygen, moisture, or various other external compounds reaching the one or more PICs 106 and other components of the photonic package assembly.

Example Devices and Components

Figure 5:
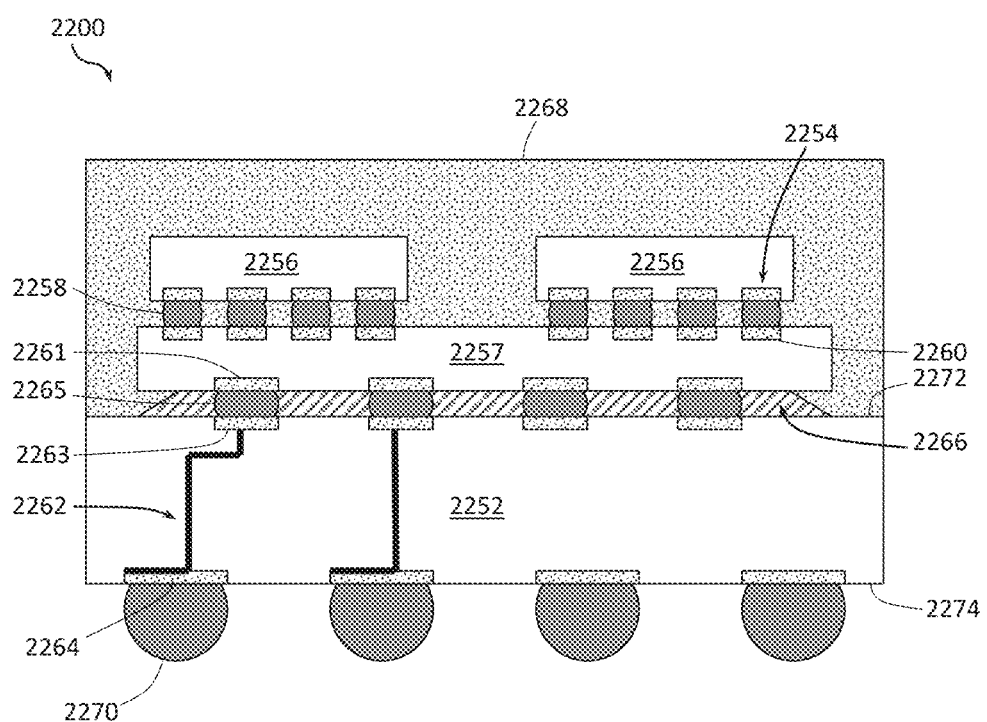
FIG. 5 is a cross-sectional side view of a package that may include one or more photonic assemblies with a bridge between a PIC die and an OCS in accordance with any of the embodiments disclosed herein.
Figure 6:
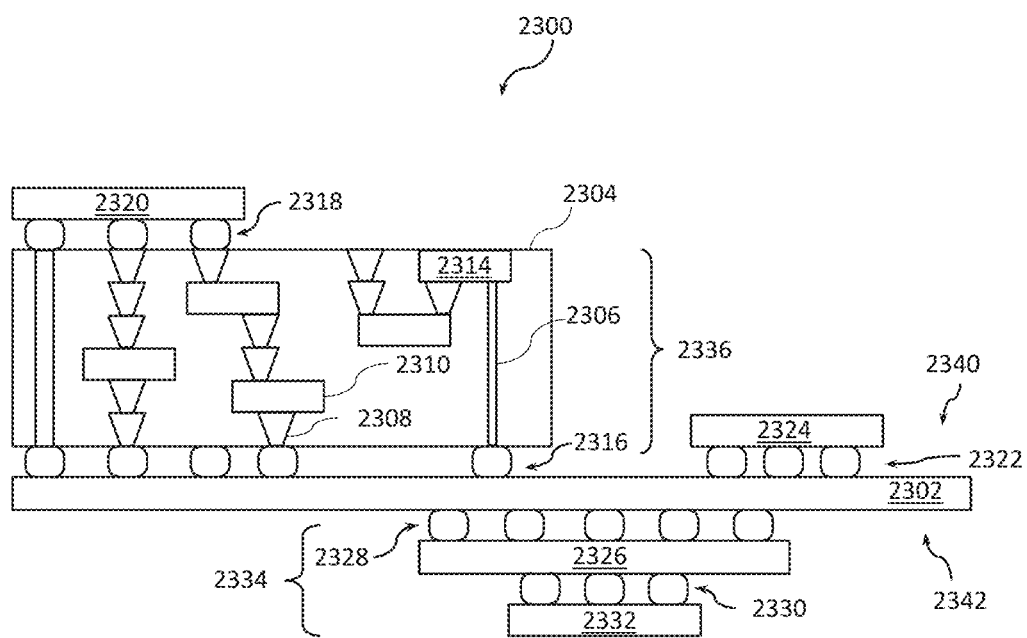
FIG. 6 is a cross-sectional side view of a device assembly that may include one or more photonic assemblies with a bridge between a PIC die and an OCS in accordance with any of the embodiments disclosed herein.
Figure 7:
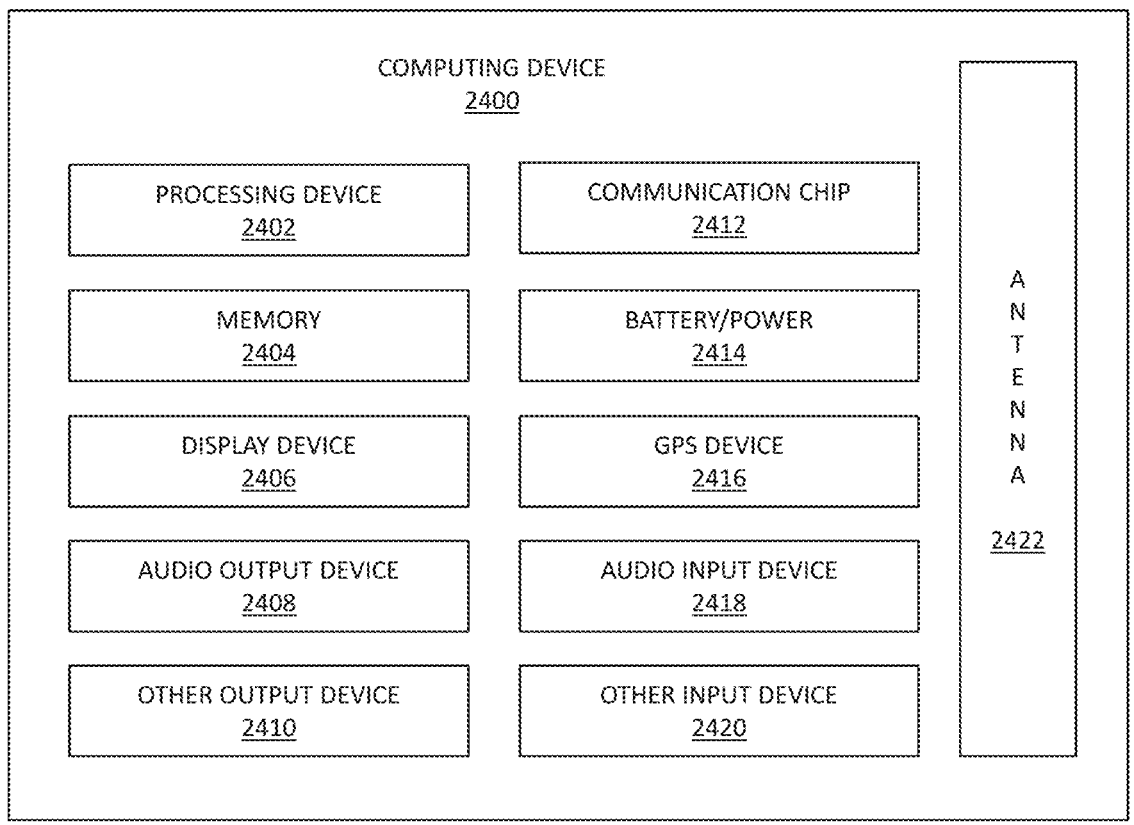
FIG. 7 is a block diagram of an example computing device that may include one or more photonic assemblies with a bridge between a PIC die and an OCS in accordance with any of the embodiments disclosed herein.

The photonic assemblies with bridge structures disclosed herein, e.g., any of the embodiments of the photonic assemblies shown in FIGS. 1-3, may be included in any suitable electronic/photonic component. FIGS. 5-7 illustrate various examples of packages, assemblies, and devices that may be used with or include any of the bridge structures providing mechanical coupling between the PIC dies and OCSs as disclosed herein.

FIG. 5 is a side, cross-sectional view of an example IC package 2200 that may include one or more photonic assemblies with a bridge between a PIC die and an OCS in accordance with any of the embodiments disclosed herein. In some embodiments, the IC package 2200 may be a system-in-package (SiP).

As shown in FIG. 5, the package substrate 2252 may be formed of a dielectric material (e.g., a ceramic, a buildup film, an epoxy film having filler particles therein, etc.), and may have conductive pathways extending through the dielectric material between the face 2272 and the face 2274, or between different locations on the face 2272, and/or between different locations on the face 2274. These conductive pathways may take the form of any of the interconnect structures comprising lines and/or vias, e.g., as discussed above with reference to FIG. 1.

The package substrate 2252 may include conductive contacts 2263 that are coupled to conductive pathways 2262 through the package substrate 2252, allowing circuitry within the dies 2256 and/or the interposer 2257 to electrically couple to various ones of the conductive contacts 2264 (or to other devices included in the package substrate 2252, not shown).

The IC package 2200 may include an interposer 2257 coupled to the package substrate 2252 via conductive contacts 2261 of the interposer 2257, first-level interconnects 2265, and the conductive contacts 2263 of the package substrate 2252. The first-level interconnects 2265 illustrated in FIG. 5 are solder bumps, but any suitable first-level interconnects 2265 may be used, such as solder bumps, solder posts, or bond wires. In the embodiments where the interposer 2257 is used, the interposer 2257 may be the PIC support structure 102 or the PIC die 104, described above.

The IC package 2200 may include one or more dies 2256 coupled to the interposer 2257 via conductive contacts 2254 of the dies 2256, first-level interconnects 2258, and conductive contacts 2260 of the interposer 2257. The conductive contacts 2260 may be coupled to conductive pathways (not shown) through the interposer 2257, allowing circuitry within the dies 2256 to electrically couple to various ones of the conductive contacts 2261 (or to other devices included in the interposer 2257, not shown). The first-level interconnects 2258 illustrated in FIG. 5 are solder bumps, but any suitable first-level interconnects 2258 may be used, such as solder bumps, solder posts, or bond wires. As used herein, a "conductive contact" may refer to a portion of electrically conductive material (e.g., metal) serving as an interface between different components; conductive contacts may be recessed in, flush with, or extending away from a surface of a component, and may take any suitable form (e.g., a conductive pad or socket).

In some embodiments, an underfill material 2266 may be disposed between the package substrate 2252 and the interposer 2257 around the first-level interconnects 2265, and a mold compound 2268 may be disposed around the dies 2256 and the interposer 2257 and in contact with the package substrate 2252. In some embodiments, the underfill material 2266 may be the same as the mold compound 2268. Example materials that may be used for the underfill material 2266 and the mold compound 2268 are epoxy mold materials, as suitable. Second-level interconnects 2270 may be coupled to the conductive contacts 2264. The second-level interconnects 2270 illustrated in FIG. 5 are solder balls (e.g., for a ball grid array arrangement), but any suitable second-level interconnects 2270 may be used (e.g., pins in a pin grid array arrangement or lands in a land grid array arrangement). The second-level interconnects 2270 may be used to couple the IC package 2200 to another component, such as a circuit board (e.g., a motherboard), an interposer, or another IC package, as known in the art and as discussed below with reference to FIG. 6.

In various embodiments, one or more of the dies 2256 may include the PIC dies 104 as described herein, mechanically coupled, via one or more bridge structures 110, to one or more OCSs 108, as described herein. The bridge structures 110 and the OCSs 108 are not specifically shown in FIG. 5 in order to not clutter the drawing, and in order to not limit the broad description of FIG. 5 to any of many possible configurations of how one or more bridge structures 110 may be attached to one or more OCSs 108 and one or more PIC dies 104 in accordance to various embodiments described herein. However, in all such embodiments, for the dies 2256 that are implemented as the PIC dies 104, the conductive contacts 2254 of the dies 2256 may be analogous to the conductive contacts 120 described above, the interconnects 2258 may be analogous to the interconnects 128 described above, and the conductive contacts 2260 of the interposer 2257 may be analogous to the conductive contacts 126 described above.

In embodiments in which the IC package 2200 includes multiple dies 2256, the IC package 2200 may be referred to as a multi-chip package (MCP). The dies 2256 may include circuitry to perform any desired functionality. For example, besides one or more of the dies 2256 being PIC dies 104 as described herein, one or more of the dies 2256 may be logic dies (e.g., silicon-based dies), one or more of the dies 2256 may be memory dies (e.g., high bandwidth memory), etc. In some embodiments, any of the dies 2256 which are implemented as PIC dies 104 may include one or more bridge structures 110, coupled to one or more OCSs 108, e.g., as discussed with reference to FIGS. 1-3. In some embodiments, at least some of the dies 2256 may not include any bridge structures as described herein.

Although the IC package 2200 illustrated in FIG. 5 is a flip-chip package, other package architectures may be used. For example, the IC package 2200 may be a ball grid array (BGA) package, such as an embedded wafer-level ball grid array (eWLB) package. In another example, the IC package 2200 may be a wafer-level chip scale package (WLCSP) or a panel fan-out (FO) package. Although two dies 2256 are illustrated in the IC package 2200 of FIG. 5, an IC package 2200 may include any desired number of dies 2256. An IC package 2200 may include additional passive components, such as surface-mount resistors, capacitors, and inductors disposed on the first face 2272 or the second face 2274 of the package substrate 2252, or on either face of the interposer 2257. More generally, an IC package 2200 may include any other active or passive components known in the art.

In some embodiments, no interposer 2257 may be included in the IC package 2200; instead, the dies 2256 may be coupled directly to the conductive contacts 2263 at the face 2272 by first-level interconnects 2265. In such embodiments, the package substrate 2252 may be analogous to the PIC support structure 102 described above, and, for the dies 2256 that are implemented as the PIC dies 104, the conductive contacts 2254 of the dies 2256 may be analogous to the conductive contacts 120 described above, the interconnects 2265 may be analogous to the interconnects 128 described above, and the conductive contacts 2263 of the package substrate 2252 may be analogous to the conductive contacts 126 described above.

FIG. 6 is a cross-sectional side view of an IC device assembly 2300 that may include components having one or more photonic assemblies with a bridge between a PIC die and an OCS in accordance with any of the embodiments disclosed herein. The IC device assembly 2300 includes a number of components disposed on a circuit board 2302 (which may be, e.g., a motherboard). The IC device assembly 2300 includes components disposed on a first face 2340 of the circuit board 2302 and an opposing second face 2342 of the circuit board 2302; generally, components may be disposed on one or both faces 2340 and 2342. In particular, any suitable ones of the components of the IC device assembly 2300 may include any of the one or more photonic assemblies with a bridge between a PIC die and an OCS in accordance with any of the embodiments disclosed herein; e.g., any of the IC packages discussed below with reference to the IC device assembly 2300 may take the form of any of the embodiments of the IC package 2200 discussed above with reference to FIG. 5 (e.g., may include one or more photonic assemblies with a bridge between any of the dies 2256 implemented as PIC dies 104, and an OCS, in accordance with any of the embodiments disclosed herein).

In some embodiments, the circuit board 2302 may be a PCB including multiple metal layers separated from one another by layers of dielectric material and interconnected by electrically conductive vias. Any one or more of the metal layers may be formed in a desired circuit pattern to route electrical signals (optionally in conjunction with other metal layers) between the components coupled to the circuit board 2302. In other embodiments, the circuit board 2302 may be a non-PCB substrate.

FIG. 6 illustrates that, in some embodiments, the IC device assembly 2300 may include a package-on-interposer structure 2336 coupled to the first face 2340 of the circuit board 2302 by coupling components 2316. The coupling components 2316 may electrically and mechanically couple the package-on-interposer structure 2336 to the circuit board 2302, and may include solder balls (as shown in FIG. 6), male and female portions of a socket, an adhesive, an underfill material, and/or any other suitable electrical and/or mechanical coupling structure.

The package-on-interposer structure 2336 may include an IC package 2320 coupled to an interposer 2304 by coupling components 2318. The coupling components 2318 may take any suitable form for the application, such as the forms discussed above with reference to the coupling components 2316. In some embodiments, the IC package 2320 may be or include the IC package 2200, e.g., as described above with reference to FIG. 5. In some embodiments, the IC package 2320 may include at least one PIC die 104 as described herein, mechanically coupled, via one or more bridge structures 110, to one or more OCSs 108, as described herein. The bridge structures 110 and the OCSs 108 are not specifically shown in FIG. 6 in order to not clutter the drawing, and in order to not limit the broad description of FIG. 6 to any of many possible configurations of how one or more bridge structures 110 may be attached to one or more OCSs 108 and one or more PIC dies 104 in accordance to various embodiments described herein.

Although a single IC package 2320 is shown in FIG. 6, multiple IC packages may be coupled to the interposer 2304; indeed, additional interposers may be coupled to the interposer 2304. The interposer 2304 may provide an intervening substrate used to bridge the circuit board 2302 and the IC package 2320. Generally, the interposer 2304 may spread a connection to a wider pitch or reroute a connection to a different connection. For example, the interposer 2304 may couple the IC package 2320 (e.g., the PIC die 104 coupled, via the bridge structure 100, to the OCS 108) to a BGA of the coupling components 2316 for coupling to the circuit board 2302. In such an example, the interposer 2304 may be analogous to the PIC support structure 102, described above.

In the embodiment illustrated in FIG. 6, the IC package 2320 and the circuit board 2302 are attached to opposing sides of the interposer 2304. In other embodiments, the IC package 2320 and the circuit board 2302 may be attached to a same side of the interposer 2304. In some embodiments, three or more components may be interconnected by way of the interposer 2304.

The interposer 2304 may be formed of an epoxy resin, a fiberglass-reinforced epoxy resin, a ceramic material, or a polymer material such as polyimide. In some implementations, the interposer 2304 may be formed of alternate rigid or flexible materials that may include the same materials described above for use in a semiconductor substrate, such as silicon, germanium, and other group III-V and group IV materials. The interposer 2304 may include metal interconnects 2308 and vias 2310, including but not limited to TSVs 2306. The interposer 2304 may further include embedded devices 2314, including both passive and active devices. Such devices may include, but are not limited to, capacitors, decoupling capacitors, resistors, inductors, fuses, diodes, transformers, sensors, electrostatic discharge (ESD) devices, and memory devices. More complex devices such as RF devices, power amplifiers, power management devices, antennas, arrays, sensors, and microelectromechanical systems (MEMS) devices may also be formed on the interposer 2304. The package-on-interposer structure 2336 may take the form of any of the package-on-interposer structures known in the art.

In some embodiments, the IC device assembly 2300 may include an IC package 2324 coupled to the first face 2340 of the circuit board 2302 by coupling components 2322. The coupling components 2322 may take the form of any of the embodiments discussed above with reference to the coupling components 2316, and the IC package 2324 may take the form of any of the embodiments discussed above with reference to the IC package 2320.

In some embodiments, the IC device assembly 2300 may include a package-on-package structure 2334 coupled to the second face 2342 of the circuit board 2302 by coupling components 2328. The package-on-package structure 2334 may include an IC package 2326 and an IC package 2332 coupled together by coupling components 2330 such that the IC package 2326 is disposed between the circuit board 2302 and the IC package 2332. The coupling components 2328 and 2330 may take the form of any of the embodiments of the coupling components 2316 discussed above, and the IC packages 2326 and/or 2332 may take the form of any of the embodiments of the IC package 2320 discussed above. The package-on-package structure 2334 may be configured in accordance with any of the package-on-package structures known in the art.

FIG. 7 is a block diagram of an example computing device 2400 that may include one or more components having one or more photonic assemblies with a bridge between a PIC die and an OCS in accordance with any of the embodiments disclosed herein. For example, any suitable ones of the components of the computing device 2400 may include a PIC die (e.g., the PIC die 104 as shown in FIG. 1 or 3), mechanically coupled to a bridge structure (e.g., the bridge structure 110 as shown in FIGS. 1-3), which is, in turn, mechanically coupled to an OCS (e.g., the OCS 108 as shown in FIGS. 1-3), in accordance with any of the embodiments disclosed herein. In another example, any one or more of the components of the computing device 2400 may include any embodiments of the IC package 2200 (e.g., as shown in FIG. 5). In yet another example, any one or more of the components of the computing device 2400 may include an IC device assembly 2300 (e.g., as shown in FIG. 6).

A number of components are illustrated in FIG. 7 as included in the computing device 2400, but any one or more of these components may be omitted or duplicated, as suitable for the application. In some embodiments, some or all of the components included in the computing device 2400 may be attached to one or more motherboards. In some embodiments, some or all of these components are fabricated onto a single system-on-a-chip (SoC) die.

Additionally, in various embodiments, the computing device 2400 may not include one or more of the components illustrated in FIG. 7, but the computing device 2400 may include interface circuitry for coupling to the one or more components. For example, the computing device 2400 may not include a display device 2406, but may include display device interface circuitry (e.g., a connector and driver circuitry) to which a display device 2406 may be coupled. In another set of examples, the computing device 2400 may not include an audio input device 2418 or an audio output device 2408, but may include audio input or output device interface circuitry (e.g., connectors and supporting circuitry) to which an audio input device 2418 or audio output device 2408 may be coupled.

The computing device 2400 may include a processing device 2402 (e.g., one or more processing devices). As used herein, the term "processing device" or "processor" may refer to any device or portion of a device that processes electronic data from registers and/or memory to transform that electronic data into other electronic data that may be stored in registers and/or memory. The processing device 2402 may include one or more digital signal processors (DSPs), application-specific integrated circuits (ASICs), central processing units (CPUs), graphics processing units (GPUs), cryptoprocessors (specialized processors that execute cryptographic algorithms within hardware), server processors, or any other suitable processing devices. The computing device 2400 may include a memory 2404, which may itself include one or more memory devices such as volatile memory (e.g., dynamic random access memory (DRAM)), nonvolatile memory (e.g., read-only memory (ROM)), flash memory, solid state memory, and/or a hard drive. In some embodiments, the memory 2404 may include memory that shares a die with the processing device 2402. This memory may be used as cache memory and may include embedded dynamic random access memory (eDRAM) or spin transfer torque magnetic random access memory (STT-M RAM).

In some embodiments, the computing device 2400 may include a communication chip 2412 (e.g., one or more communication chips). For example, the communication chip 2412 may be configured for managing wireless communications for the transfer of data to and from the computing device 2400. The term "wireless" and its derivatives may be used to describe circuits, devices, systems, methods, techniques, communications channels, etc., that may communicate data through the use of modulated electromagnetic radiation through a nonsolid medium. The term does not imply that the associated devices do not contain any wires, although in some embodiments they might not.

The communication chip 2412 may implement any of a number of wireless standards or protocols, including but not limited to Institute for Electrical and Electronic Engineers (IEEE) standards including Wi-Fi (IEEE 802.11 family), IEEE 802.16 standards (e.g., IEEE 802.16-2005 Amendment), Long-Term Evolution (LTE) project along with any amendments, updates, and/or revisions (e.g., advanced LTE project, ultramobile broadband (UMB) project (also referred to as "3GPP2"), etc.). IEEE 802.16 compatible Broadband Wireless Access (BWA) networks are generally referred to as WiMAX networks, an acronym that stands for Worldwide Interoperability for Microwave Access, which is a certification mark for products that pass conformity and interoperability tests for the IEEE 802.16 standards. The communication chip 2412 may operate in accordance with a Global System for Mobile Communication (GSM), General Packet Radio Service (GPRS), Universal Mobile Telecommunications System (UMTS), High Speed Packet Access (HSPA), Evolved HSPA (E-HSPA), or LTE network. The communication chip 2412 may operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). The communication chip 2412 may operate in accordance with Code Division Multiple Access (CDMA), Time Division Multiple Access (TDMA), Digital Enhanced Cordless Telecommunications (DECT), Evolution-Data Optimized (EV-DO), and derivatives thereof, as well as any other wireless protocols that are designated as 3G, 4G, 5G, and beyond. The communication chip 2412 may operate in accordance with other wireless protocols in other embodiments. The computing device 2400 may include an antenna 2422 to facilitate wireless communications and/or to receive other wireless communications (such as AM or FM radio transmissions).

In some embodiments, the communication chip 2412 may manage wired communications, such as electrical, optical, or any other suitable communication protocols (e.g., the Ethernet). As noted above, the communication chip 2412 may include multiple communication chips. For instance, a first communication chip 2412 may be dedicated to shorter-range wireless communications such as Wi-Fi or Bluetooth, and a second communication chip 2412 may be dedicated to longer-range wireless communications such as global positioning system (GPS), EDGE, GPRS, CDMA, WiMAX, LTE, EV-DO, or others. In some embodiments, a first communication chip 2412 may be dedicated to wireless communications, and a second communication chip 2412 may be dedicated to wired communications.

The computing device 2400 may include battery/power circuitry 2414. The battery/power circuitry 2414 may include one or more energy storage devices (e.g., batteries or capacitors) and/or circuitry for coupling components of the computing device 2400 to an energy source separate from the computing device 2400 (e.g., AC line power).

The computing device 2400 may include a display device 2406 (or corresponding interface circuitry, as discussed above). The display device 2406 may include any visual indicators, such as a heads-up display, a computer monitor, a projector, a touchscreen display, a liquid crystal display (LCD), a light-emitting diode display, or a flat panel display, for example.

The computing device 2400 may include an audio output device 2408 (or corresponding interface circuitry, as discussed above). The audio output device 2408 may include any device that generates an audible indicator, such as speakers, headsets, or earbuds, for example.

The computing device 2400 may include an audio input device 2418 (or corresponding interface circuitry, as discussed above). The audio input device 2418 may include any device that generates a signal representative of a sound, such as microphones, microphone arrays, or digital instruments (e.g., instruments having a musical instrument digital interface (MIDI) output).

The computing device 2400 may include a GPS device 2416 (or corresponding interface circuitry, as discussed above). The GPS device 2416 may be in communication with a satellite-based system and may receive a location of the computing device 2400, as known in the art.

The computing device 2400 may include an other output device 2410 (or corresponding interface circuitry, as discussed above). Examples of the other output device 2410 may include an audio codec, a video codec, a printer, a wired or wireless transmitter for providing information to other devices, or an additional storage device.

The computing device 2400 may include an other input device 2420 (or corresponding interface circuitry, as discussed above). Examples of the other input device 2420 may include an accelerometer, a gyroscope, a compass, an image capture device, a keyboard, a cursor control device such as a mouse, a stylus, a touchpad, a bar code reader, a Quick Response (QR) code reader, any sensor, or a radio frequency identification (RFID) reader.

The computing device 2400 may have any desired form factor, such as a handheld or mobile computing device (e.g., a cell phone, a smart phone, a mobile internet device, a music player, a tablet computer, a laptop computer, a netbook computer, an ultrabook computer, a personal digital assistant (PDA), an ultramobile personal computer, etc.), a desktop computing device, a server or other networked computing component, a printer, a scanner, a monitor, a set-top box, an entertainment control unit, a vehicle control unit, a digital camera, a digital video recorder, or a wearable computing device. In some embodiments, the computing device 2400 may be any other electronic device that processes data.

SELECT EXAMPLES

The following paragraphs provide various examples of the embodiments disclosed herein.

Example 1 provides a photonic package assembly that includes a photonic integrated circuit (PIC) die, the PIC die including one or more PICs, an OCS positioned adjacent to the PIC die such that electromagnetic signals may be exchanged between at least one of the one or more PICs and the OCS, and a bridge structure which provides mechanical coupling the OCS and the PIC die. Each of the one or more PICs may include means for transmitting and/or processing electromagnetic signals having information encoded therein. In other words, each of the one or more PICs may be configured to transmit and/or process information imposed on electromagnetic signals, and/or configured to modulate electromagnetic signals to include information in the electromagnetic signals being transmitted from the PIC.

Example 2 provides the photonic package assembly according to example 1, where the photonic package assembly further includes a PIC support structure, each of the PIC die and the OCS has a first face and an opposite second face, the first face of each of the PIC die and the OCS is closer to the PIC support structure than the second face (i.e., the first face of each of the PIC die and the OCS faces the PIC support structure), and the bridge structure mechanically couples the OCS and the PIC die by being attached to (namely, by having respective portions attached to) a portion of the second face of each of the PIC die and the OCS.

Example 3 provides the photonic package assembly according to example 2, where the bridge structure is a planar (i.e., flat, as opposed to, e.g., curved) structure, covering a portion of the second face of each of the PIC die and the OCS. The bridge structure may be such that no part of the bridge structure is attached to the first face of the OCS, e.g., the bridge structure may be such that it does not encircle the OCS as a sleeve.

Example 4 provides the photonic package assembly according to examples 2 or 3, where the bridge structure suspends the OCS above the PIC support structure.

Example 5 provides the photonic package assembly according to any one of examples 2-4, where the first face of the OCS faces the PIC support structure. Thus, the bridge structure may be such that it does not completely enclose the OCS on all sides.

Example 6 provides the photonic package assembly according to any one of examples 2-5, where a part of the OCS that includes the portion of second face of the OCS attached to the bridge structure, the bridge structure, and a part of the PIC die that includes the portion of the second face of the PIC die attached to the bridge structure form a bridge.

Example 7 provides the photonic package assembly according to any one of examples 2-6, where the first face of the OCS is separated from the PIC support structure by a gap. Thus, the OCS may be suspended over the PIC support structure by means of the bridge structure.

Example 8 provides the photonic package assembly according to example 7, where the gap is at least 50 micrometers in a direction perpendicular to the PIC support structure.

Example 9 provides the photonic package assembly according to any one of examples 2-8, where the one or more PICs are provided on the first face of the PIC die. Thus, the PIC die may be attached to the PIC support structure in a flip-chip configuration.

Example 10 provides the photonic package assembly according to any one of examples 2-9, further including one or more electronic integrated circuits (EICs), provided on the first face of the PIC die. Thus, the PIC die may include not only photonic but also electronic ICs.

Example 11 provides the photonic package assembly according to any one of examples 2-10, further including one or more of epoxy (e.g., UV cure epoxy and/or thermal cure epoxy) and soldering between the bridge structure and the second face of the OCS.

Example 12 provides the photonic package assembly according to any one of examples 2-11, further including one or more of epoxy (e.g., UV cure epoxy and/or thermal cure epoxy) and soldering between the bridge structure and the second face of the PIC die. Thus, in some embodiments, the bridge structure may be attached to the PIC die using epoxy and/or soldering. In other embodiments, the bridge structure may be attached to the PIC die using laser curling, laser welding, or any attachment method that solidifies in a relatively short time and with relatively little movement.

Example 13 provides the photonic package assembly according to any one of examples 2-12, where the PIC support structure is one of an interposer, a package substrate, or a circuit board (e.g., a PCB).

Example 14 provides the photonic package assembly according to any one of the preceding examples, where the bridge structure has a coefficient of thermal expansion below about 7 parts per million per degree Centigrade (ppm/° C.), preferably below about 2-3 ppm/° C.

Example 15 provides the photonic package assembly according to any one of the preceding examples, where the bridge structure is substantially transparent to UV light.

Example 16 provides the photonic package assembly according to any one of the preceding examples, where the PIC die and the OCS are provided over different portions of a PIC support structure (thus, the electromagnetic coupling between the OCS and the PIC die may be edge-coupling).

Example 17 provides the photonic package assembly according to any one of the preceding examples, further including an isolator, configured to reduce the back reflection that goes back to the PIC, provided in an optical path between the OCS and the PIC die.

Example 18 provides the photonic package assembly according to example 17, where the isolator is attached to the OCS.

Example 19 provides the photonic package assembly according to any one of the preceding examples, further including a fiber-optic cable, coupled to the OCS.

Example 20 provides a photonic coupling assembly that includes an OCS and a bridge structure. In this example, the bridge structure has a first planar portion attached to a portion of one face of the OCS, and further has a second planar portion configured to be attached to a portion of one face of a PIC die (the PIC die including one or more PICs as described above and zero or more electronic ICs).

Example 21 provides the photonic coupling assembly according to example 20, where the second planar portion extends away from the OCS.

Example 22 provides the photonic coupling assembly according to examples 20 or 21, where the bridge structure is configured to mechanically couple the OCS to the PIC die to enable exchange of electromagnetic signals between the OCS and at least one of one or more PICs included in the PIC die.

Example 23 provides the photonic coupling assembly according to any one of examples 20-22, where the OCS has a first end and an opposite second end, and where the first planar portion of the bridge structure is attached to the portion of the OCS that is proximate the first end.

Example 24 provides the photonic coupling assembly according to example 23, further including an isolator, coupled to the first end of the OCS.

Example 25 provides the photonic coupling assembly according to examples 23 or 24, where the second end of the OCS is configured to be coupled to a fiber-optic cable.

Example 26 provides the photonic coupling assembly according to any one of examples 20-25, where the OCS and the bridge structure of any one of examples 20-25 are included in the photonic package assembly according to any one of examples 1-19.

Example 27 provides a method of fabricating a photonic package assembly, the method including providing a PIC die, the PIC die including one or more PICs (e.g., as described above); providing a photonic coupling assembly that includes an OCS and a bridge structure, the bridge structure having a first portion attached to a portion of one face of the OCS; and attaching a second portion of the bridge structure to a portion of one face of the PIC die, so that electromagnetic signals may be exchanged between at least one of the one or more PICs and the OCS.

Example 28 provides the method according to example 27, where the second portion of the bridge structure is attached to the portion of one face of the PIC die so that a part of the OCS that includes the portion of one face of the OCS attached to the first portion of the bridge structure, the bridge structure, and a part of the PIC die that includes the portion of one face of the PIC die attached to the second portion of the bridge structure form a bridge.

Example 29 provides the method according to examples 27 or 28, where the OCS has a first end and an opposite second end, and where, when the second portion of the bridge structure is attached to the portion of one face of the PIC die, the first end of the OCS is closer to the PIC die than the second end.

Example 30 provides the method according to example 29, further including attaching the second end of the OCS to a fiber-optic cable.

Example 31 provides the method according to any one of examples 27-30, further including encapsulating at least a portion of the photonic package assembly that includes the photonic coupling assembly attached to the PIC die.

Example 32 provides the method according to any one of examples 27-31, where each of the first portion and the second portion of the bridge structure is a planar portion.

Example 33 provides the method according to any one of examples 27-32, further including processes to provide the photonic package assembly according to any one of examples 1-19 and/or processes to provide the photonic coupling assembly according to any one of examples 20-26.

The above description of illustrated implementations of the disclosure, including what is described in the Abstract, is not intended to be exhaustive or to limit the disclosure to the precise forms disclosed. While specific implementations of, and examples for, the disclosure are described herein for illustrative purposes, various equivalent modifications are possible within the scope of the disclosure, as those skilled in the relevant art will recognize.

The invention claimed is:

1. A photonic package assembly, comprising:
a photonic integrated circuit (PIC) die, the PIC die comprising a PIC, the PIC configured to transmit electromagnetic signals having information encoded therein;
an optical coupling structure (OCS) positioned adjacent to the PIC die such that the electromagnetic signals may be exchanged between a side face of the PIC and a face of the OCS, where each of the side face of the PIC and the face of the OCS is perpendicular to a plane of the PIC die over which the PIC is provided and the side face of the PIC is opposite the face of the OCS; and
a bridge structure, mechanically coupling the OCS and the PIC die.

2. The photonic package assembly according to claim 1, wherein:
the photonic package assembly further includes a PIC support structure;
each of the PIC die and the OCS has a first face and an opposite second face,
the first face of each of the PIC die and the OCS is closer to the PIC support structure than the second face, and
the bridge structure mechanically couples the OCS and the PIC die by being attached to a portion of the second face of each of the PIC die and the OCS.

3. The photonic package assembly according to claim 2, wherein the bridge structure is a planar structure, covering a portion of the second face of each of the PIC die and the OCS.

4. The photonic package assembly according to claim 2, wherein the bridge structure suspends the OCS above the PIC support structure.

5. The photonic package assembly according to claim 2, wherein the first face of the OCS faces the PIC support structure.

6. The photonic package assembly according to claim 2, wherein a part of the OCS that includes the portion of second face of the OCS attached to the bridge structure, the bridge structure, and a part of the PIC die that includes the portion of the second face of the PIC die attached to the bridge structure form a bridge.

7. The photonic package assembly according to claim 2, wherein the first face of the OCS is separated from the PIC support structure by a gap.

8. The photonic package assembly according to claim 7, wherein the gap is at least 50 micrometers in a direction perpendicular to the PIC support structure.

9. The photonic package assembly according to claim 2, wherein the PIC is provided on the first face of the PIC die.

10. The photonic package assembly according to claim 2, further including one or more of epoxy and soldering between the bridge structure and the second face of the PIC die.

11. The photonic package assembly according to claim 2, wherein the PIC support structure is one of:
an interposer,
a package substrate, or
a circuit board.

12. The photonic package assembly according to claim 1, wherein the bridge structure has a coefficient of thermal expansion below 7 parts per million per degree Centigrade.

13. The photonic package assembly according to claim 1, wherein the PIC die and the OCS are provided over different portions of a PIC support structure.

14. A photonic coupling assembly, comprising:
an optical coupling structure (OCS); and
a bridge structure, having a first planar portion attached to a portion of one face of the OCS, and having a second planar portion configured to be attached to a portion of one face of a photonic integrated circuit (PIC) die that includes a PIC, the PIC configured to transmit information imposed on electromagnetic signals,
wherein:
the second planar portion is configured to be attached to the portion of one face of the PIC die to enable exchange of the electromagnetic signals between a side face of the PIC and a side face of the OCS,
the side face of the OCS is opposite the side face of the PIC, and each of the side face of the OCS and the side face of the PIC is perpendicular to the second planar portion.

15. The photonic coupling assembly according to claim 14, wherein the bridge structure is configured to mechanically couple the OCS to the PIC die.

16. The photonic coupling assembly according to claim 14, wherein the OCS has a first end and an opposite second end, and wherein the first planar portion of the bridge structure is attached to the portion of the OCS that is proximate the first end.

17. The photonic coupling assembly according to claim 16, further comprising an isolator, coupled to the first end of the OCS.

18. The photonic coupling assembly according to claim 16, wherein the second end of the OCS is configured to be coupled to a fiber-optic cable.

19. A method of fabricating a photonic package assembly, the method comprising:

providing a photonic integrated circuit (PIC) die, the PIC die comprising a PIC, the PIC configured to modulate electromagnetic signals to include information;

providing a photonic coupling assembly that includes an optical coupling structure (OCS) and a bridge structure, the bridge structure having a first portion attached to a portion of one face of the OCS; and after the first portion of the bridge structure has been attached to the portion of one face of the OCS, attaching a second portion of the bridge structure to a portion of one face of the PIC die.

20. The method according to claim 19, wherein the second portion of the bridge structure is attached to the portion of one face of the PIC die so that a part of the OCS that includes the portion of one face of the OCS attached to the first portion, the bridge structure, and a part of the PIC die that includes the portion of one face of the PIC die attached to the second portion form a bridge.

\* \* \* \* \*